(12) United States Patent
Cheng

(10) Patent No.: US 7,479,807 B1
(45) Date of Patent: Jan. 20, 2009

(54) LEAKAGE DEPENDENT ONLINE PROCESS VARIATION TOLERANT TECHNIQUE FOR INTERNAL STATIC STORAGE NODE

(75) Inventor: Zhibin Cheng, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/776,820

(22) Filed: Jul. 12, 2007

(51) Int. Cl.
*H03K 19/096* (2006.01)
(52) U.S. Cl. .......................... 326/98; 326/95; 326/121
(58) Field of Classification Search ............. 326/94–98, 326/112, 119, 121
See application file for complete search history.

(56) References Cited

U.S. PATENT DOCUMENTS 5,345,110 A * 9/1994 Renfro et al. ................ 327/199
6,125,069 A * 9/2000 Aoki ......................... 365/225.7
6,232,799 B1 * 5/2001 Allen et al. .................. 326/113
7,256,621 B2 * 8/2007 Lih et al. ..................... 326/121

* cited by examiner

*Primary Examiner*—Anh Q Tran
(74) *Attorney, Agent, or Firm*—Joscelyn G. Cockburn; Schubert Osterrieder & Nickelson PLLC

(57) ABSTRACT

A device is disclosed for providing compensation current continuously to compensate for leakage current at the node of an electrical circuit, such as a chip. The device includes a dummy storage cell, a single staged current mirror circuit and a non reconfigurable keeper circuit. The keeper can be used to compensate for a wide range of leakage corners where the internal storage is located. The adaptive keeper circuit not only increases the robustness of the storage node against leakage caused by process variation but also improves the overall performance of the static storage device connected to the node.

9 Claims, 5 Drawing Sheets

LEAKAGE DEPENDENT ONLINE PROCESS VARIATION TOLERANT TECHNIQUE FOR INTERNAL STATIC STORAGE NODE

BACKGROUND OF THE INVENTION

1. Technical Field

The present invention generally relates to integrated circuits and in particular to leakage current in integrated circuits. Still more particular, the present invention relates to compensation of leakage current in integrated circuits.

2. Cross Reference to Related Patent Application

The present application relates to Application Serial No. (RPS9 20060191US1); "Automatic Self-Adaptive Keeper System With Current Sensor For Real-Time /on Line Compensation For Leakage Current Variations"; Filed Jul. 3, 2007; Inventor: Zhibin Cheng and assigned to the assignee of the present invention. The referenced patent application is incorporated in its entirety in the present application.

3. Description of Related Art

The use of keeper circuit arrangements to compensate for leakage current at an internal node of a storage device is well known in the prior art.

For example, U.S. patents 6,844,750 B2, 7,002,375 B2 U.S. published patent applications U.S. 2004/189337A1 and U.S.2005/01046121 all describe keeper type circuit arrangements. Although, these circuit arrangements work well for intended purposes they share a common set of design characteristics which are not necessarily desirable for some situations or use. The design characteristics are that the keeper circuit arrangements are digitally controlled, over design to compensate for maximum leakage conditions and compensate by varying the physical dimension of the keeper. The physical dimension of the keeper may be varied by increasing/decreasing the number of devices in the keeper circuit.

As a consequence, there is a need to provide a keeper circuit arrangement that do not share the undesirable common design characteristics set forth above, yet still provide compensation on a real time basis for all leakages including leakage resulting from process variation relating to the process use to manufacture the chip.

SUMMARY OF THE INVENTION

Disclosed is a device for automatically detecting and optimally compensating for leakage current under a wide range of leakage conditions. The device includes a non-configurable keeper circuit fabricated from a plurality of field effect transistors (FETs) operatively connected in series. The keeper circuit is operatively connected to the node of a storage device to be protected. A current mirror formed by parallel connected FET devices are operatively connected to a leakage current generator which generates leakage current (I|k1), proportional to the leakage current at the protected node. The leakage current is amplified by the current mirror and supply to the keeper circuit to compensate for the leakage current at the protected node.

The keeper system of the present invention provides online protection that holds the internal storage node (protected node) with optimal compensation strength against leakage. The keeper system also provides on line compensation for leakage resulting from all process variation corners. The keeper system and techniques can also be used as a burn-in keeper. Burn-in tests are done at elevated temperatures and supply voltage conditions which lead to a large increase leakage current in storage circuits such as a wide MUX latch circuit to be described in great detail herein after. This increases the need for utilizing strong keeper to ensure the functionality during the test where weaker keepers can be used in normal operational conditions.

The above as well as additional objective, features and advantages of the present invention will become apparent in the following detailed written description.

DETAILED DESCRIPTION OF AN EMBODIMENT

The present invention can be used with any node to be protected against leakage current. It works well with a storage system such as a static wide MUX latch circuit. As such it will be described in this environment. However, this should not be construed as in limitation on the scope of the present invention, since it is well within the skill of one skilled in the art to make minor and/or insignificant changes to the embodiment set forth herein. Any such changes are intended to be covered by the claims set forth herein.

Figure 1:
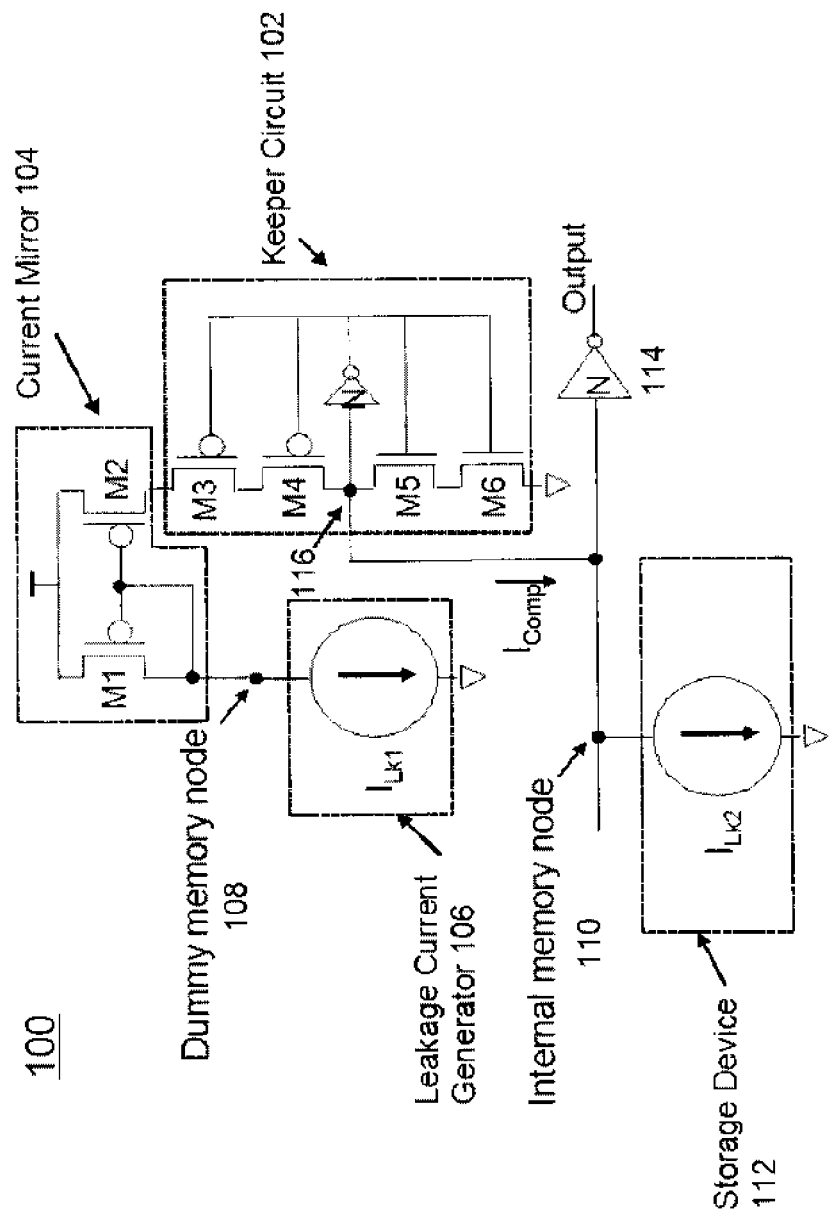
FIG. 1 shows a logical representation of an integrated circuit (IC) with a keeper system according to the teachings of the present invention.

FIG. 1 shows a conceptual representation of integrated circuit (IC) 100 according to the teachings of the present invention. The IC circuit includes storage device 112, keeper circuit 102, current mirror 104 and leakage current generator 106. Storage device 112 generates the leakage current I|k2 which depletes electrical charge at internal memory node 110. The output from internal memory node 110 is received by inverter 114 and is made available as the output signal from storage device 112. The keeper circuit 102, details to be given hereafter, has an output node 116 which is connected to internal memory node 110 and provides compensation current Icomp which replenishes the leakage current at internal memory node 110. The current mirror 104 is operatively coupled to dummy memory node 108 and the keeper circuit 102. The leakage current generator 106 generates leakage current I|k1 at dummy memory node 108. Dummy leakage current I|k1 is proportional to the leakage current generated by the storage device 112. In one embodiment the leakage current I|k1 is the same as leakage current I|k2. The current mirror 104 senses leakage current I|k1 at dummy memory node 108 amplifies the current and forward it to the keeper circuit which replenishes the leakage current I|k2 at internal memory node 110.

Still referring to FIG. 1, leakage current at internal memory node 110 is reflected at dummy memory node 108 by leakage current generator 106. The leakage current at the dummy memory node 108 is sensed and amplified through the current mirror circuit 104. The leakage compensating current flows through the keeper. The adaptive leakage compensation is then generated online by keeper circuit 102, while the physical dimension of the keeper remains the same. This is in contrast to prior art keepers which change dimension to compensate for leakage current. The dimension may be changed by increasing/decreasing the number of devices in the keeper circuit. Stated another way there are multiple current paths through the prior art keeper circuits, with each path having different number of devices, depending on which path is selected the number of devices changes resulting in a reconfigurable keeper. Unlike prior art reconfigurable keepers, the number of devices forming the keeper circuit of the present invention is fixed and cannot be changed. As a consequence, the keeper circuit of the present invention is referred to as non-reconfigurable.

Figure 2:
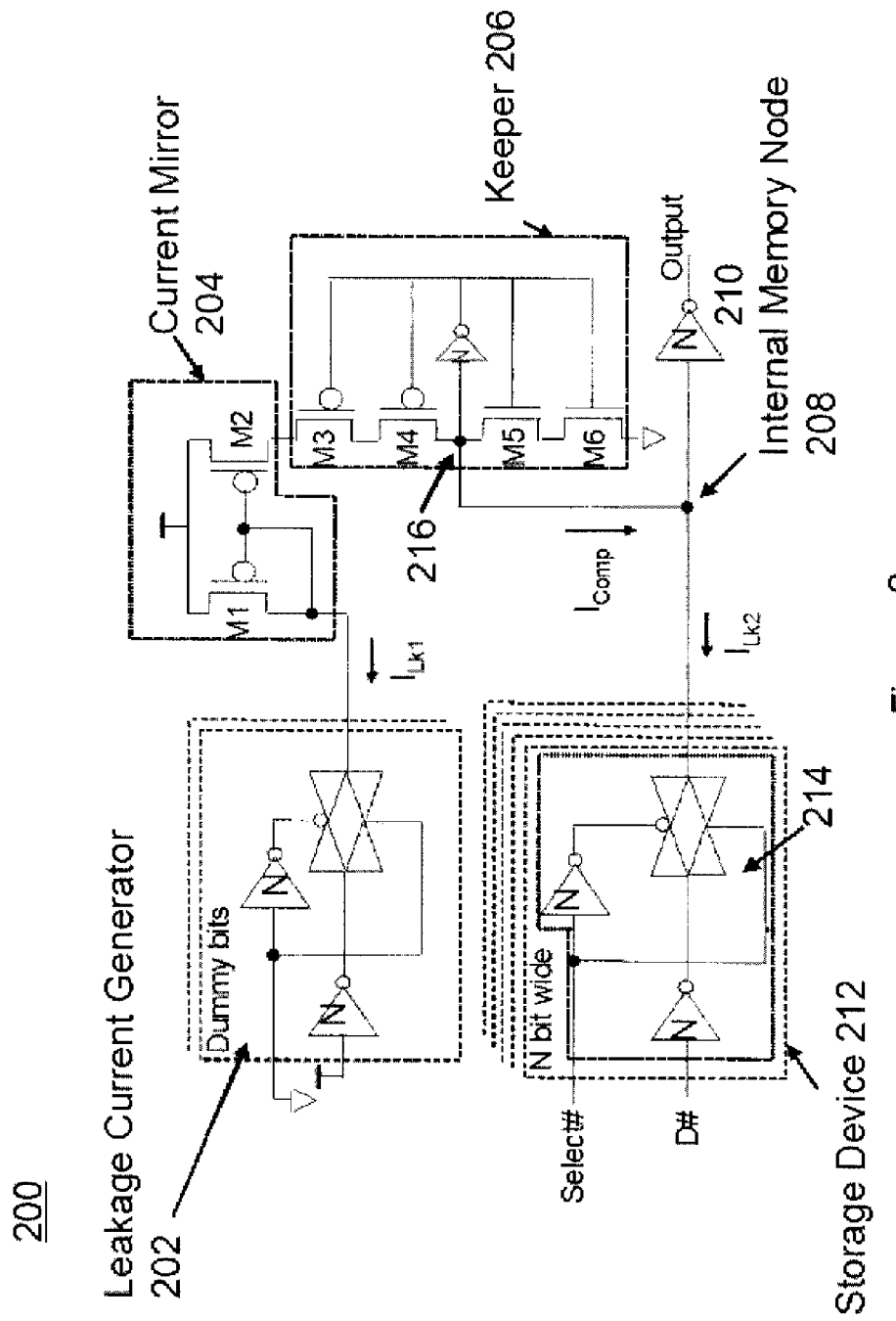
FIG. 2 shows an integrated circuit schematic according to the teachings of the present invention.

FIG. 2 shows an IC device 200 according to teachings of the present invention. The IC device includes internal memory node 208 to which output circuit 210, keeper circuit 206 and storage device 212 are connected. Current mirror circuit 204 couples leakage current generate 202 to the keeper circuit 206. The function of the keeper circuit 206, current mirror 204 and leakage current generator 202 is to provide compensation current Icomp that compensate for leakage current I|k2 resulting from leakage in the storage device 212.

Figure 3:
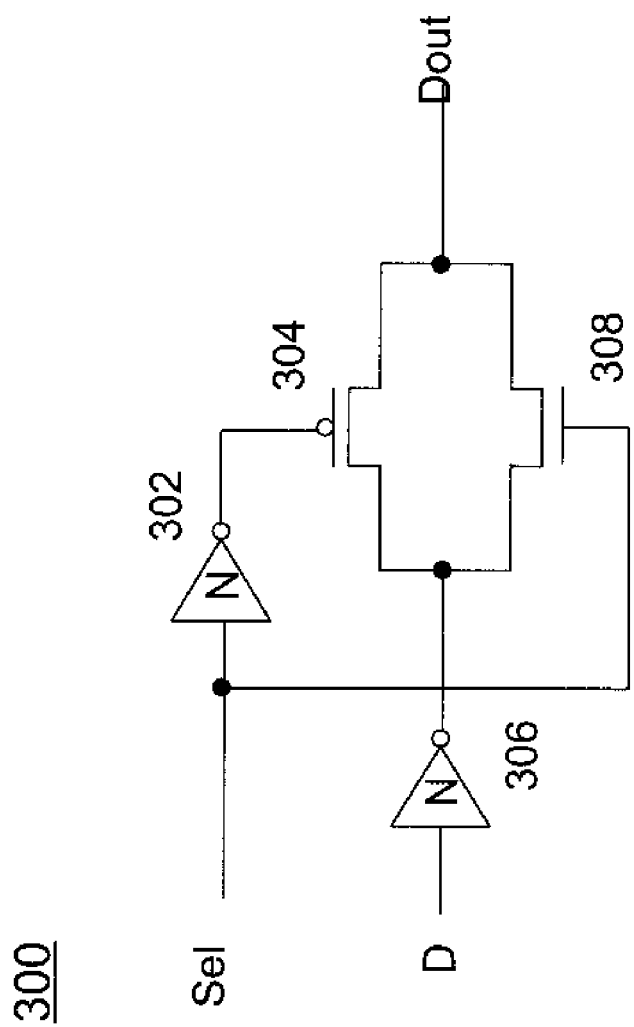
FIG. 3 shows a circuit arrangement for generating bits in the MUX of FIG. 2.

Still referring to FIG. 2, the storage device 212 is an N bit wide Mux circuit. In one embodiment of the present invention N=16. Each bit of the Mux is generated by identical circuits one of which is identified by numeral 214. Turning to FIG. 3 for the moment, a more detailed schematic of the bit generation circuit 214 is shown. The circuit includes P FET device 304 and N FET device 308 connected in parallel. An input signal line labeled SEL is connected by Inverter 302 to the P FET. Likewise, a data line labeled D is connected by Inverter 308 to the P FET and NFET devices. The output signal is provided on the signal line labeled Dout. In operation, the signal on Dout is active if the signal on SEL is active and data is present on the line labeled D. Even though a specific circuit arrangement is shown and describe for the storage device 212 (FIG. 2) this should not be construed as a limitation on the scope of the present inventions since it is well within the skill of one skilled in the art to provide devices that produce leakage current when connected to internal memory node 208 without departing from the teachings of the present invention.

Referring again to FIG. 2, the leakage current generator 202 is formed from a subset of the bits in storage device 212. The subset termed dummy bits is selected to generate a current termed I|k1 which is proportional to the leakage current I|k2 formed as a result of leakage in the device connected to internal memory node 208. In the preferred embodiment of the present invention I|k1 is substantially equivalent to I|k2. By so doing an accurate amount of compensation current is provided at internal memory node 208 via current mirror 204 and keeper circuit 206. Each of the dummy bit circuit is substantially equivalent to the circuit describe and shown in FIG. 3.

Figure 4A:
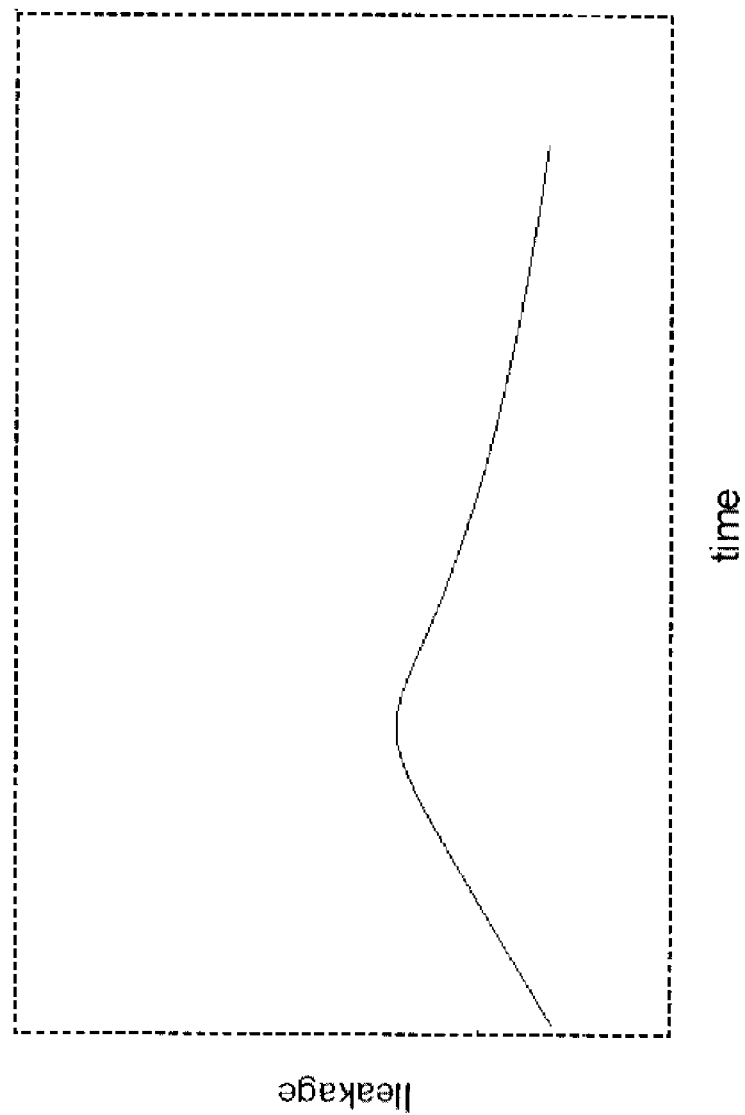
FIGS. 4a and 4b show curves representing leakage currents and are helpful in understanding the present invention.
Figure 4B:
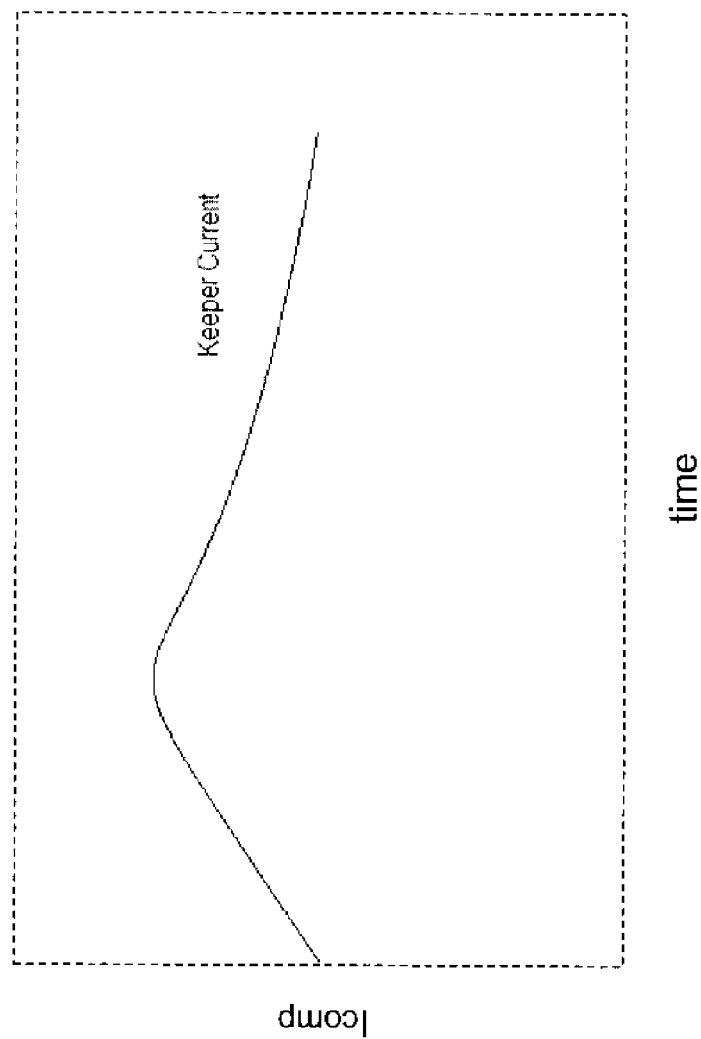

Still referring to FIG. 2, the current mirror circuit 204 includes P FETs M1 and M2 connected via gate electrodes. The drain electrode of M1 is connected to the gate connection of both devices. The source electrodes of both devices are connected to a common power supply. The drain electrode of M2 provides the output signal. With the P FETs connected as shown in FIG. 2 the circuit can be characterized as a single stage current mirror. In this configuration M1 function as a diode for sensing the signal outputted from the dummy bits and M2 amplifies the sensed signal. It should be noted, except for amplification, the current mirror passes the current signal with the same waveform shape as it is received from the dummy bits. As shown in FIGS. 4A and 4B the waveform of the signal is continuous and may be considered as an analog signal which is in contrast to prior art in which digital signals are used to maintain Icomp at the internal memory node 208. By using an analog signal as oppose to a digital signal several benefits, including requires less complicated circuit structures with reduced area and power, provides continuous on line compensation for leakage resulting from all process variation corners, protects the internal storage node with optimal compensation strength against leakage, are provided by the present invention.

Still referring to FIG. 2, the keeper circuit 206 includes P FETs devices M3, M4 and N FETs devices M5 and M6. The devices are connected in series with an output node 216 connected to the gate electrodes of the devices by an inverter labeled N. With this configuration, a fixed number of devices latches the analog current signal and provide it through node 216 to Internal memory node 208. This configuration of the keeper is in contrast with the reconfigurable keeper circuit in which different signal paths with different number of devices provide compensation current to internal memory node 208. Due to the single path with N devices the Keeper circuit of the present invention is termed non-reconfigurable as oppose to the reconfigurable keeper circuit of the prior art.

FIGS. 4A and 4B show analog waveforms of the leakage current I|k1 and compensation current Icomp. As discussed herein these are the current signals used to compensate for leakage current due to leakage in the device connected to internal memory node 208. In both Figures time is represented on the horizontal axis and current is represented on the vertical axis. In particular, FIG. 4A shows the leakage current I|k1 generated by the dummy bits (FIG. 2). This current passes through the current mirror 204 (FIG. 2) without, other than amplification, any changes in the waveform. Likewise, FIG. 48 shows the waveform of the current signal exiting the Keeper circuit (FIG. 2). As can be seen from these figures the current waveform is analog and does not change or altered, except for amplification, during transmission through the Keeper circuit and the current mirror.

Having described the structure of a circuit that provides analog compensation to the node of a device, its operation will now be given. The leakage current at dummy memory node 108 is sensed and amplified through the current mirror circuit 104. The leakage compensation current is transmitted through a non reconfigurable keeper circuit 102 to internal memory node 110. As a consequence, the adaptive leakage compensation current is generated on line by this circuit while the physical dimension of the keeper circuit remains the same. The current is used to compensate the leakage current I|k2 (FIG. 2) in the 16-to-1 static MUX-latch to restore the internal storage node to a predefined voltage level.

While the invention has been particularly shown and describe with reference to an embodiment , it should be understood by those skill in the art that various changes in form and details may be made therein without departing from the spirit and scope of the present invention.

What is claimed is:

1. A device for maintaining voltage on a node of first electrical circuit comprising:

a leakage current generator for generating a predefined analog current passing through a first transistor of a current mirror circuit, a current mirror circuit comprising a first and second transistor, the current mirror circuit coupled to the leakage current generator so that the predefined analog current passes through the first transistor and wherein a second current passes through the second transistor, the second analog current being proportional to the predefined analog current; and a non-reconfigurable keeper circuit operatively coupled between and to the second transistor of the current mirror circuit and the node of the first electrical circuit, thereby isolating the current mirror from the node of the first electrical circuit, the keeper circuit comprising a first set of P-type transistors connected in series from drain to source and a second set of N-type transistors connected in series from drain to source to the P-type transistors, thereby exhibiting a node of the keeper circuit between the P-type and N-type transistors, the keeper circuit node being electrically connected to the node of the first electrical circuit, the keeper circuit node further connected through an inverter to all the gates of the N-type and P-type transistors in the keeper circuit.

2. The device of claim 1, wherein the first electrical circuit is a storage-device operatively coupled to said node.

3. The device of claim 2 wherein the storage device includes a multiplexer (MUX).

4. The device of claim 2, wherein the predefined analog current is proportional to leakage current caused by said storage device.

5. The device of claim 3, wherein the MUX is in a ration n:m, wherein n>1 and m=1.

6. The device of claim 2, wherein the generator includes a group of dummy bits circuits.

7. The device of claim 6, wherein the group of dummy bits is proportioned to bits in the storage device.

8. The device of claim 1, wherein the current mirror includes a first device for sensing current at a first node and a second device for amplifying sensed current and providing said sensed current at a second node.

9. The device of claim 1, wherein the current mirror includes a single stage.

* * * * *